United States Patent
Quelo

[19]

[11] Patent Number: 6,124,774
[45] Date of Patent: Sep. 26, 2000

[54] ELECTROMAGNETIC CONTROL MOTOR DEVICE, PARTICULARLY A RATIO METER

[75] Inventor: Vincent Quelo, Nanterre, France

[73] Assignee: Magneti Marelli France, France

[21] Appl. No.: 09/155,726

[22] PCT Filed: Apr. 3, 1997

[86] PCT No.: PCT/FR97/00604

§ 371 Date: Oct. 2, 1998

§ 102(e) Date: Oct. 2, 1998

[87] PCT Pub. No.: WO97/38319

PCT Pub. Date: Oct. 16, 1997

[30] Foreign Application Priority Data

May 4, 1996 [FR] France .................................. 96 04322

[51] Int. Cl.[7] ................................. G01R 1/20; H01F 7/08
[52] U.S. Cl. ........................... 335/272; 310/85; 310/152; 324/146
[58] Field of Search .................................... 335/236, 237, 335/272, 278; 324/144, 145, 146, 147; 310/85, 89, 152, 156

[56] References Cited

U.S. PATENT DOCUMENTS

| 5,275,141 | 1/1994 | Tsunoda et al. | 123/399 |
| 5,578,918 | 11/1996 | Baatz | 324/146 |

FOREIGN PATENT DOCUMENTS

| 0 660088 | 6/1995 | European Pat. Off. . |
| 3541395 | 6/1986 | Germany . |
| 564181 | 9/1944 | United Kingdom . |

*Primary Examiner*—Michael L. Gellner
*Assistant Examiner*—Raymond Barrera
*Attorney, Agent, or Firm*—Blakely Sokoloff Taylor & Zafman

[57] ABSTRACT

The present invention relates to an electromagnetically controlled drive device, in particular a ratio meter, the device being of the type comprising: a set of control coils (10, 20); a frame (50) which carries the set of coils (10, 20); equipment including a magnet suitable for being pivoted by the set of control coils (10, 20); and magnetic shielding (100) surrounding the set of coils (10, 20) and the support frame, at least in part, the device being characterized by the fact that the shielding (100) comprises an annular skirt (110) that is not a circular cylinder.

7 Claims, 2 Drawing Sheets

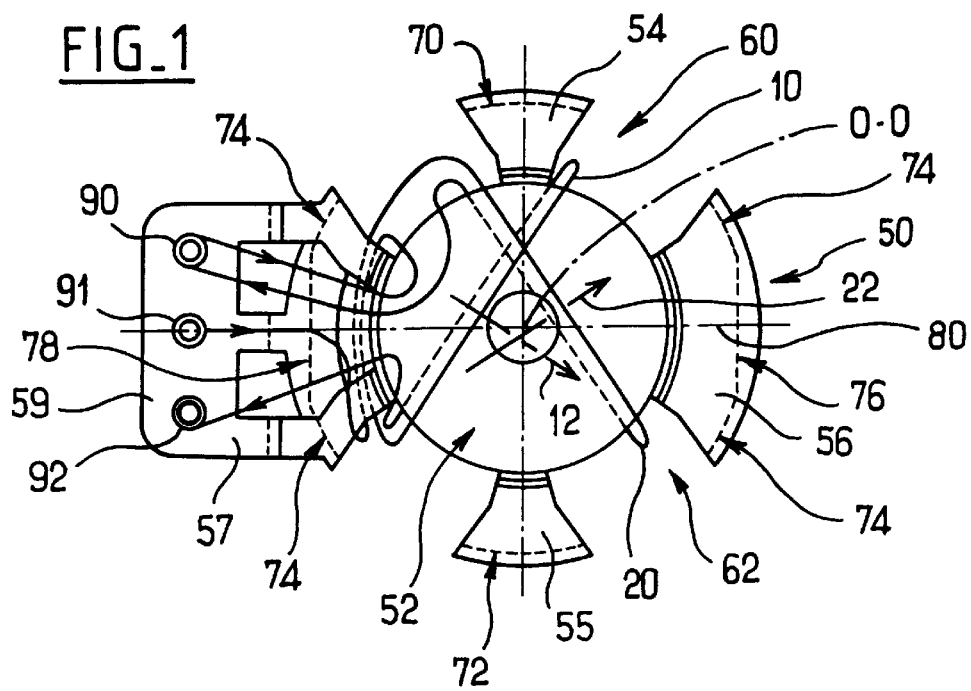
FIG_1
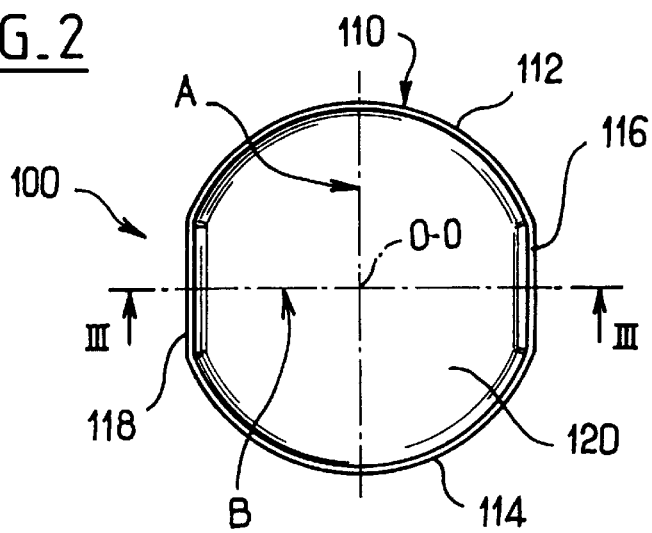
FIG_2
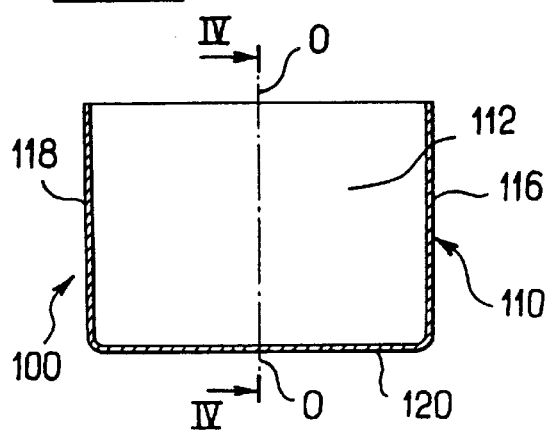
FIG_3
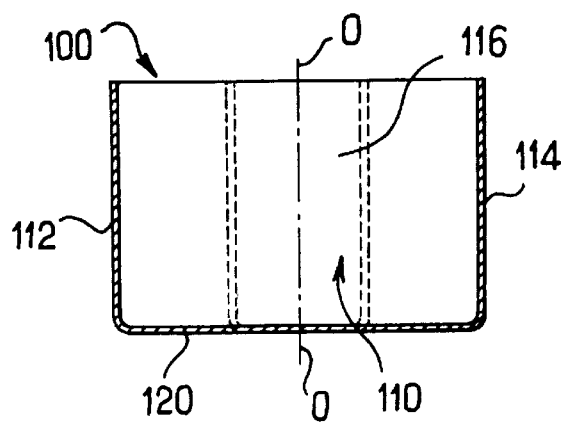
FIG_4

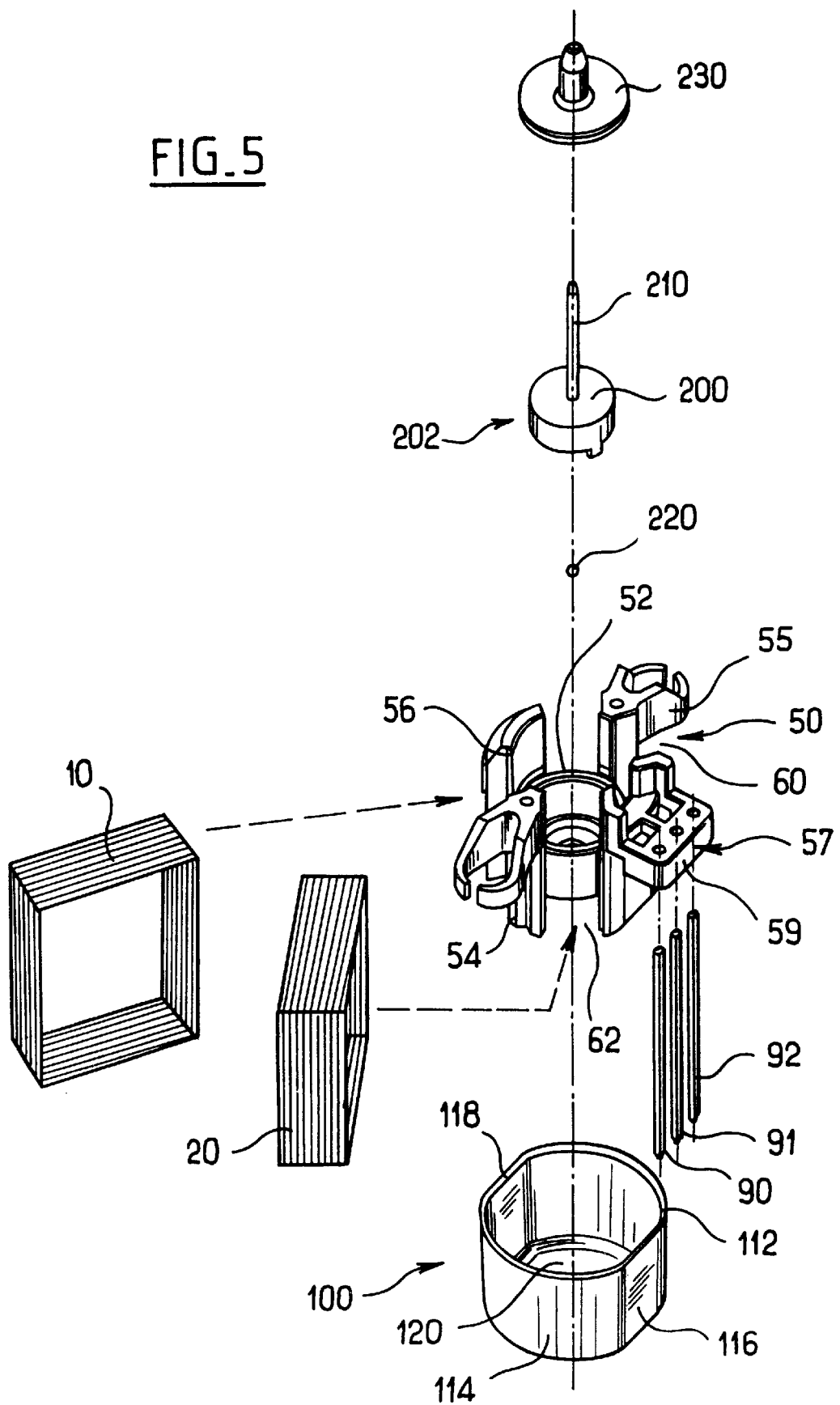

ELECTROMAGNETIC CONTROL MOTOR DEVICE, PARTICULARLY A RATIO METER

BACKGROUND OF THE INVENTION

1. Field of the Invention

The present invention relates to the field of electromagnetically controlled drive devices, in particular devices known as "ratio meters".

A particular application for the present invention lies with indicator dials for the dashboards of motor vehicles.

2. Prior Art

It is known that in general a ratio meter comprises:

two crossed control coils;

a radially-magnetized magnet rotatably mounted in an internal chamber defined by said coils;

a shaft associated with the magnet and on its axis, the shaft being adapted to receive the hub of a dial needle; and magnetic shielding which surrounds the coils, at least in part.

The control coils are generally carried by a support frame made of plastics material.

The direction in which the needle points depends on the resultant of the magnetic fields created by the two coils.

Thus, if the two coils are fed with signals representing the sine/cosine or the tangent of an input magnitude, then the angle taken up by the magnet relative to a reference position is directly representative of said input magnitude.

Until now, the magnetic shielding has usually been provided in the form of a cylindrical metal bell.

Also until now, the rest position of the moving equipment of such an electromagnetically controlled drive has been set by adding auxiliary magnets or springs, thereby leading to structures that are complex. Document DE-A-3 541 395 describes magnetic shielding formed by a spiral winding of metal foil.

Document GB-A-564 181 describes an indicator having a magnet and a coil and including two screws located inside external shielding and suitable for being adjusted to set the rest position of the device.

SUMMARY OF THE INVENTION

The present invention now seeks to improve known electromagnetically controlled drives.

According to the present invention, this object is achieved by an electromagnetically controlled drive device which comprises:

a set of control coils (10, 20);

a frame (50) which carries the set of coils (10, 20);

equipment including a magnet suitable for being pivoted by the set of control coils (10, 20); and magnetic shielding (100) surrounding the set of coils (10, 20) and the support frame, at least in part, the device being characterized by the fact that the shielding (100), which is made by stamping a sheet of soft magnetic metal, comprises an annular skirt (110) that is not a circular cylinder.

According to an advantageous characteristic of the present invention, the shielding comprises an annular skirt that is generally a circular cylinder, but that possesses at least one re-entrant shape that is reentrant relative to the circular cylinder.

In a variant, two shapes that are re-entrant relative to the circular cylinder are provided in this way. These re-entrant shapes can comprise planes. Nevertheless, the re-entrant shapes may be of different geometry. The two re-entrant shapes may be diametrically opposite about the axis of the device. However in certain variants, these two re-entrant shapes are on the contrary not diametrically opposite.

According to an advantageous characteristic of the invention, the shielding comprises an annular skirt that is not a circular cylinder and that possesses two orthogonal planes of symmetry intersecting on the axis of rotation of the equipment.

In another variant of the invention, the annular skirt of the shielding is generally in the form of an ellipse.

According to another advantageous characteristic of the invention, the annular skirt comprises two diametrically-opposite sectors of a circular cylinder interconnected by two parallel planes.

The invention, together with the objects and advantages thereof, may best be understood by reference to the following detailed description with reference to the accompanying drawings given by way of non-limiting example, and in which:

BRIEF DESCRIPTION OF THE DRAWINGS

FIG. 1 is an axial plane view of a support frame for a ratio meter in accordance with the present invention;

FIG. 2 is an end view of magnetic shielding in accordance with the present invention;

FIG. 3 is a first section view through the shielding on a section plane referenced III—III in FIG. 2;

FIG. 4 is a second section view through the same shielding on a section plane referenced IV—IV in FIG. 3; and FIG. 5 is a diagrammatic exploded view of a ratio meter in accordance with the present invention.

The general internal structure of the ratio meter comprising coils 10, 20, a magnet 200, and a needle-carrying shaft 210 is known per se and is not described in detail below.

The two coils 10, 20 are placed on a support frame 50 as shown in FIG. 1.

The support frame 50 is preferably made by molding plastics material. The frame 50 defines a central hub 52 centered on the axis of rotation O—O of the moving equipment, and two pairs of projections 54, 55, 56, and 57 disposed in a cross configuration. The projections in each pair 54 & 55 and 56 & 57 are diametrically opposite each other, with the projections of the second pair 56 & 57 being orthogonal to those of the first pair 54 & 55 about the central axis O—O. The above-mentioned projections 54, 55, 56, and 57 extend in directions that are generally radial relative to the axis O—O. Between them, the two pairs of projections 54 & 55 and 56 & 57 thus define two annular housings 60 and 62 suitable for receiving the coils 10 and 20 respectively, which coils are themselves centered on axes 12 and 22 extending transversely relative to the central axis O—O.

The hub 52 is adapted to guide the moving equipment 202 comprising the magnet 200 and the needle-carrying shaft 210.

The two projections 54 & 55 of the first pair define on their outer peripheries respective same-radius cylindrical caps 70 and 72 centered on the axis O—O. The two projections 56 & 57 of the second pair may likewise define same-radius cylindrical cap sections 74. However, as shown in FIG. 1, these latter two projections 56 & 57 also define on their outer peripheries two respective mutually parallel planes 76 and 78 that are diametrically opposite about the axis O—O.

The frame 50 also defines an internal abutment (not shown in FIG. 1 to simplify the illustration) adapted to co-operate with the moving equipment, e.g. the magnet, so as to limit the angle through which it can pivot.

In the example shown in accompanying FIG. 1, the two coils 10 and 20 are mutually inclined at 110°. Nevertheless, this inclination should not be considered as limiting. It can easily be adapted as a function of the intended application.

According to the present invention, the ratio meter includes shielding 100 of the type shown in FIGS. 2 to 4, comprising an annular peripheral skirt 110 centered on the axis of rotation O—O and completed by a disk-shaped wall 120 orthogonal to the axis O—O. In accordance with the invention, the annular peripheral skirt 110 has two planes of symmetry A and B that intersect on the axis of rotation O—O of the equipment.

The shielding 100 is made of a soft magnetic metal, preferably by being stamped. More precisely, the shielding 100 is preferably made using a sheet of iron-nickel alloy, e.g. 64% iron and 36% nickel.

The end wall 120 of the shielding 100 can be provided with passages for pins connected to the coils 10 and 20. Nevertheless, it is preferable, as shown in FIG. 1, for the coils 10 and 20 to be connected electrically by means of pins 90, 91, and 92 connected to the ends of the coils 10 and 20 and carried on a protuberance 59 extending the projection 57, which protuberance 59 is disposed on the outside of the shielding 100, close to the outline of its opening.

In the particular embodiment of the shielding 100 shown in FIGS. 2 to 4, the peripheral annular skirt 110 of the shielding 100 comprises two diametrically-opposite cylindrical sectors 112 and 114 centered on the axis O—O and interconnected by two planes 116 and 118 that are parallel to each other and to the axis O—O, and that are likewise diametrically opposite thereabout. The planes 116 and 118 are parallel to the plane of symmetry A and perpendicular to the plane of symmetry B.

The angular extent of the sectors 112 and 114 is advantageously about 150°.

The radius of the cylindrical sectors 112 and 114 is complementary to the radius of the cylindrical caps 70, 72, and 74. In addition, the distance between the planes 116 or 118 and the axis O—O is complementary to the distance between the planes 76 or 78 formed on the frame 50 and the same axis O—O.

The person skilled in the art will thus understand that the shielding 100 can easily be fixed to the frame 50, e.g. by adhesive, ultrasonic bonding, hot crimping, etc. . . . or by using any equivalent means that avoids deforming the shielding 100.

It will be observed that according to another advantageous characteristic of the invention, the axes 12 and 52 of the coils 10 and 20 are not orthogonal to the planes 116 and 118 of the shielding. By way of non-limiting example, the axes 12 and 22 of the coils 10 and 20 are inclined by about 350 relative to the plane of symmetry 80, B perpendicular to the planes 116 and 118 of the shielding.

This characteristic makes it possible to obtain a pivot angle for the moving equipment about the axis O—O that is greater than the angle which would be obtained merely by controlling the field generated by the coil 10 and 20 in the presence of shielding 100 that is circularly cylindrical.

Thus, when the coil 10 is powered, in the presence of circularly cylindrical shielding 100, the magnet of the moving equipment would normally align itself on the axis 12 of said coil 10. However, because of the presence of the planes 116 and 118 of the shielding 100, the axis of the magnet carried by the moving equipment tends to take up a position that is intermediate between the axis 12 of the coil 10 and the axis 80 which is orthogonal to the planes 116 and 118.

This gives rise to lag in the counterclockwise direction for the position of the moving equipment relative to the control imparted by the coil 10 on its own.

The opposite effect is obtained when the coil 20 is powered. In the presence of circularly cylindrical shielding, the axis of the magnet of the moving equipment would normally align itself on the axis 22 of the coil 20 when the coil is powered, whereas with shielding 100 of the invention, the axis of the magnet of the moving equipment takes up a position that is intermediate between said axis 22 of the coil 20 and the abovementioned plane 80 orthogonal to the planes 116 and 118 of the shielding. This thus provides a lead in the counterclockwise direction for the moving equipment relative to the axis 22 of the coil 20 on its own.

FIG. 5 also shows a ball 220 placed in a central chamber at the end of the frame 50 to serve as a support for one end of the shaft 210 secured to the magnet 200, and a shaft support 230 adapted to be fixed on the frame 50 to guide the other end of the shaft 210.

The general operation of the ratio meter shown in the accompanying figures is as follows.

The coils 10 and 20 are powered by conventional signals that take account of the geometry of the coils, and more precisely of the relative inclination between them and the reluctance of the shielding 100.

Together the two coils 10 and 20 create a field that imparts a torque if the magnet 200 is moved away from its position. The shielding 100 also creates a torque because it is not circularly symmetrical. The stable positions of these two torques do not coincide. The angle occupied by the magnet 200 is the angle which corresponds to the sum of the two torques being zero.

When the power supply is turned off, because of the varying reluctance of the shielding 100 due to its lack of circular symmetry, the magnet of the moving equipment tends to align itself on the plane of symmetry 80 that is orthogonal to the planes 116 and 118, and thus comes to bear without bounce on the mechanical abutment provided in the ratio meter.

The ratio meter of the present invention provides numerous advantages over previously known devices.

Firstly, it will be observed that the ratio meter of the present invention is completely symmetrical about the plane 80. Consequently, it can be driven without difficulty in either of two opposite directions of rotation, and this can be done with the same response curve of angle as a function of control signal regardless of the direction of rotation. This constitutes a major advantage over prior ratio meters with return being provided by a magnet or by a spiral spring, since they have asymmetrical response curves which depend on the direction of rotation.

In addition, the ratio meter of the present invention makes it possible to increase the pivot amplitude of the moving equipment compared with that which result solely from control by the coils 10 and 20.

Finally, the ratio meter of the present invention is simple to manufacture and to assemble, and it does not require any fundamental change to manufacturing or installation lines.

Naturally, the present invention is not limited to the particular embodiment described above, but extends to any variant within the spirit of the invention.

As mentioned above, in more general manner, the shielding 100 of the present invention comprises a generally circular cylindrical annular skirt 110 having at least one re-entrant shape (e.g. a plane or some other shape) relative to said circular cylinder. It can have two re-entrant shapes that are optionally diametrically opposite.

In another variant, the shielding 100 can have a section that is generally elliptically shaped.

What is claimed is:

1. An electromagnetically controlled drive device, comprising:

a set of control coils;

a frame which carries the set of coils;

equipment including a magnet suitable for being pivoted by the set of control coils; and a magnetic shielding surrounding the set of coils wherein the shielding is made of a sheet of soft magnetic metal comprising an annular skirt in form of two diametrically-opposite sectors of a cylinder interconnected by two diametrically-opposite planes. such that said annular skirt of the shielding possesses two orthogonal planes of symmetry intersecting on an axis of rotation of the equipment and wherein the axes of the coils are not orthogonal to the lanes of symmetry of the shielding.

2. A device according to claim 1, wherein the axes of the coils are inclined by about 35° relative to a plane of symmetry perpendicular to the planes of the shielding.

3. A device according to claim 1, wherein the coils are inclined relative to each other by about 110°.

4. A device according to claim 1, wherein the shielding is made of soft steel.

5. A device according to claim 1, wherein the angular extent of each of the cylindrical sectors of the shielding is about 150°.

6. A ratio meter comprising:

two control coils which are inclined relative to each other by about 110°;

a frame which carries the control coils;

a rotor including a magnet suitable for being pivoted by the control coils; and a magnetic shielding surrounding at least in part the coils and the support frame, wherein the shielding is made from a sheet of soft steel and comprises two diametrically-opposite sectors of a circular cylinder interconnected by two parallel planes so that the shielding possesses two orthogonal planes of symmetry intersecting on an axis of rotation O—O of the equipment, and wherein the axes of the coils are inclined by about 35° relative to a plane of symmetry perpendicular to the planes of the shielding.

7. A ratio meter according to claim 6, wherein the angular extent of each of the cylindrical sectors of the shielding is about 150°.

\* \* \* \* \*

UNITED STATES PATENT AND TRADEMARK OFFICE
CERTIFICATE OF CORRECTION

PATENT NO. : 6,124,774
DATED : September 26, 2000
INVENTOR(S) : Quelo

It is certified that error appears in the above-identified patent and that said Letters Patent is hereby corrected as shown below:

<u>Column 5, claim 1,</u>
Line 25, delete "lanes" and insert -- planes --.

Signed and Sealed this

First Day of January, 2002

Attest:

JAMES E. ROGAN
*Attesting Officer*     *Director of the United States Patent and Trademark Office*